United States Patent
Maeda (10) Patent No.: US 8,078,900 B2
(45) Date of Patent: Dec. 13, 2011

(54) ASYNCHRONOUS ABSORPTION CIRCUIT WITH TRANSFER PERFORMANCE OPTIMIZING FUNCTION

(75) Inventor: Taro Maeda, Kyoto (JP)

(73) Assignee: Panasonic Corporation, Osaka (JP)

( * ) Notice: Subject to any disclaimer, the term of this patent is extended or adjusted under 35 U.S.C. 154(b) by 807 days.

(21) Appl. No.: 12/166,668

(22) Filed: Jul. 2, 2008

(65) Prior Publication Data

US 2009/0039953 A1    Feb. 12, 2009

(30) Foreign Application Priority Data

Aug. 9, 2007   (JP) ................. 2007-207622

(51) Int. Cl.
*G06F 1/00*   (2006.01)
*G06F 1/12*   (2006.01)

(52) U.S. Cl. .................. 713/500; 713/400; 713/501

(58) Field of Classification Search .................. 713/500, 713/501, 400
See application file for complete search history.

(56) References Cited

U.S. PATENT DOCUMENTS

| 5,758,131 | A  | * | 5/1998  | Taylor ........................... 713/401 |
| 5,987,083 | A  |   | 11/1999 | Matsushita et al. |
| 6,049,887 | A  | * | 4/2000  | Khandekar et al. ........... 713/503 |
| 7,836,324 | B2 | * | 11/2010 | Subramanian et al. ....... 713/500 |
| 2002/0199124 | A1 | * | 12/2002 | Adkisson ....................... 713/400 |
| 2004/0193936 | A1 | * | 9/2004  | Kelly ............................. 713/500 |
| 2006/0291323 | A1 | * | 12/2006 | Freebern ....................... 365/233 |
| 2007/0063744 | A1 |   | 3/2007  | Matsumuro et al. |
| 2008/0195884 | A1 | * | 8/2008  | Subramanian et al. ....... 713/500 |

FOREIGN PATENT DOCUMENTS

| JP | 8-163399 A    | 6/1996  |
| JP | 2000-115147 A | 4/2000  |
| JP | 2005-327078 A | 11/2005 |

* cited by examiner

*Primary Examiner* — Vincent Tran
(74) *Attorney, Agent, or Firm* — McDermott Will & Emery LLP (57) ABSTRACT

A selector is provided so that any one of a plurality of asynchronous absorption paths can be selected when it is assumed that operating frequencies of preceding and succeeding clock domains vary depending on the application. By an operation of a selector control circuit based on, for example, information about a ratio of preceding and succeeding clock frequencies that is set in a frequency-ratio register, an asynchronous absorption path that is optimal to a frequency-dependent process required for asynchronous absorption, such as pulse expansion or the like, is selected.

5 Claims, 6 Drawing Sheets

ASYNCHRONOUS ABSORPTION CIRCUIT WITH TRANSFER PERFORMANCE OPTIMIZING FUNCTION

BACKGROUND OF THE INVENTION

1. Field of the Invention

The present invention relates to an asynchronous absorption circuit in a system LSI that has a plurality of clock domains and in which operating frequencies of the clock domains vary depending on the application, or an asynchronous absorption circuit between two LSIs in a set system including a plurality of system LSIs.

2. Description of the Related Art

A system LSI has blocks having asynchronous frequency domains or a set system has a plurality of system LSIs having asynchronous frequency domains. There is a known technique in which a signal is transferred via an asynchronous absorption circuit capable of stable asynchronous absorption by expanding a pulse signal having a clock of a preceding stage at an asynchronous absorption interface.

According to a conventional technique, a frequency dividing means is provided upstream of a pulse generating circuit so that a signal can be reliably transferred between circuits that operate with different clock frequencies in a network display, for example (see Japanese Unexamined Patent Application Publication No. 2000-115147).

Figure 1:
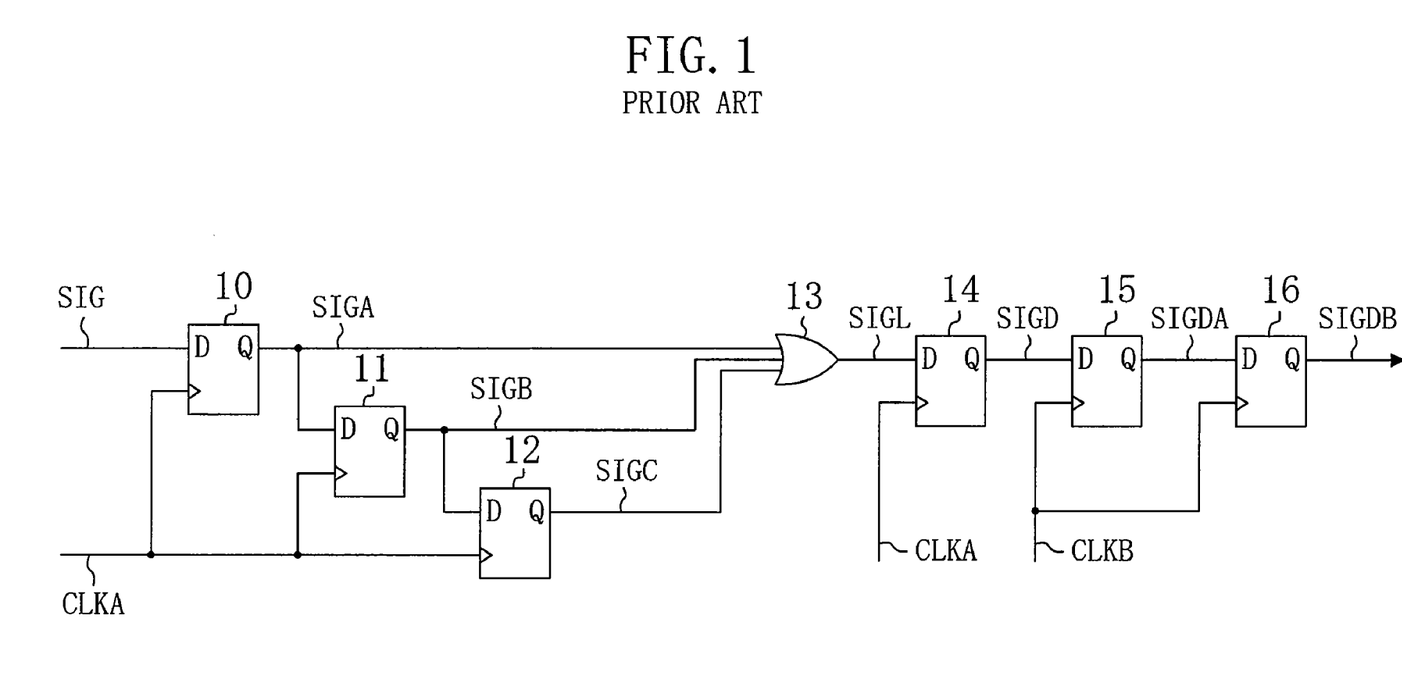
FIG. 1 is a diagram showing an exemplary configuration of a conventional asynchronous absorption circuit.

FIG. 1 shows an exemplary conventional asynchronous absorption circuit including a frequency dividing means. In FIGS. 1, 10, 11 and 12 indicate first to third flip-flops, 13 indicates a three-input OR gate, and 14, 15 and 16 indicate fourth to sixth flip-flops, SIG indicates an input signal, CLKA indicates a clock signal of a preceding stage (hereinafter referred to as a preceding clock signal), and CLKB indicates a clock signal of a succeeding stage (hereinafter referred to as a succeeding clock signal). The first to fourth flip-flops 10, 11, 12 and 14 receive the preceding clock signal CLKA. The fifth and sixth flip-flops 15 and 16 receive the succeeding clock signal CLKB. The input signal SIG is a pulse signal that has a HIGH period whose length corresponds to one cycle of the preceding clock signal CLKA.

For example, the preceding clock signal CLKA has a frequency of 67.5 MHz, and the succeeding clock signal CLKB has a frequency of 28.93 MHz. The three-input OR gate 13 receives an output signal SIGA of the first flip-flop 10, an output signal SIGB of the second flip-flop 11, and an output signal SIGC of the third flip-flop 12, and supplies a frequency-divided signal SIGL to the fourth flip-flop 14. Specifically, the frequency-divided signal SIGL is a signal that is obtained by expanding the HIGH period (one cycle of CLKA) of the input signal SIG by a factor of three.

An output signal SIGD of the fourth flip-flop 14 is input to the fifth flip-flop 15 that operates in synchronization with the succeeding clock signal CLKB. An output signal SIGDA of the fifth flip-flop 15 is input to the sixth flip-flop 16 that operates in synchronization with the succeeding clock signal CLKB. SIGDB indicates an output signal of the sixth flip-flop 16.

SUMMARY OF THE INVENTION

In a main memory I/F of DDR-SDRAM or the like or a medium I/F of an SD card or the like, the operating frequencies of preceding and succeeding clock domains are expected to vary depending on the application. This is because the main memory I/F and the medium I/F have various operating frequency specifications, and select an optimal frequency in view of performance required for a system, power consumption, physical wiring, or the like.

In the conventional asynchronous absorption circuit of FIG. 1, for example, even when the frequency of the succeeding clock signal CLKB is 90 MHz, the HIGH period of the input signal SIG is expanded by a factor of three. In other words, pulses are unnecessarily expanded. In this case, for example, in a circuit in which a succeeding circuit operates in the event of negation of a pulse, transfer of the pulse negation is delayed, so that data transfer performance is deteriorated.

To solve the above-described problems, an object of the present invention is to provide a mechanism for optimizing a process of a frequency-dependent section in an asynchronous absorption circuit based on clock information about preceding and succeeding stages.

In the present invention, the above-described problems are solved as follows. In an asynchronous absorption circuit in which various preceding and succeeding clock frequencies are assumed to be used, a function of selecting an optimal asynchronous absorption path for a frequency-depending portion that requires asynchronous absorption, such as expansion of a pulse based on information about the clock frequencies or the like, is added, for example.

More specifically, for example, in a system LSI having an asynchronous absorption circuit provided between different clock domains, a pulse generating circuit for expanding one cycle of preceding clock pulse to a required number of pulses each of which has a length corresponding to a plurality of the cycles is provided so that, when preceding and succeeding clock frequencies of the asynchronous absorption circuit are not constant and vary depending on the application, one cycle of signal in a preceding frequency domain is stably transferred to a succeeding frequency domain for all assumed frequency combinations. For example, by providing a frequency-ratio register for holding frequency-ratio information about preceding and succeeding circuits that is set by a CPU and a selector for selecting an optimal pulse based on the information in the frequency-ratio register, an optimal asynchronous absorption path can be selected for all assumed frequency combinations.

According to the present invention, it is possible to optimize a frequency-dependent process, such as selection of a pulse expansion factor optimal to preceding and succeeding clock frequencies with respect to an asynchronous interface in an asynchronous absorption circuit. Therefore, a deterioration in performance can be suppressed in the asynchronous absorption circuit, so that the performance of the whole system LSI or set system can be improved.

DETAILED DESCRIPTION OF THE PREFERRED EMBODIMENTS

Figure 2:
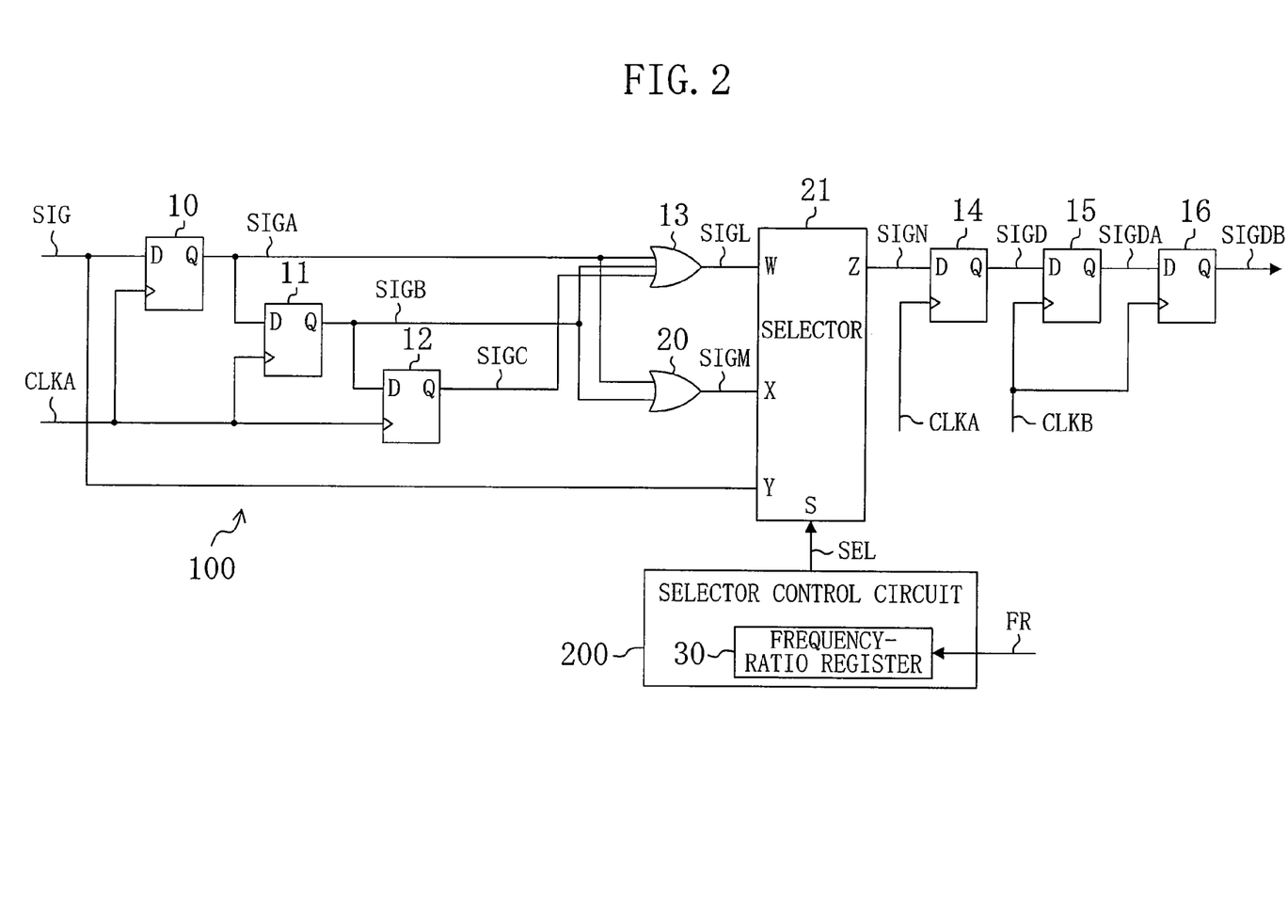
FIG. 2 is a diagram showing an exemplary configuration of an asynchronous absorption circuit according to the present invention.

FIG. 2 shows an exemplary configuration of an asynchronous absorption circuit according to the present invention. The asynchronous absorption circuit of FIG. 2 includes a pulse generating circuit 100 that is obtained by adding a two-input OR gate 20 and a selector 21 to the configuration of FIG. 1 and thus has three asynchronous absorption paths. The asynchronous absorption circuit of FIG. 2 further includes a selector control circuit 200 for selecting an optimal path from the three asynchronous absorption paths.

Specifically, a first input W to the selector 21 is the frequency-divided signal SIGL of the three-input OR gate 13 that is obtained by expanding the HIGH period (one cycle of CLKA) of the input signal SIG by a factor of three. A second input X of the selector 21 is a frequency-divided signal SIGM of the two-input OR gate 20 that is obtained by expanding the HIGH period (one cycle of CLKA) of the input signal SIG by a factor of two. A third input Y of the selector 21 is the input signal SIG as it is.

In this example, it is assumed that the preceding clock signal CLKA has a frequency of 67.5 MHz, and the succeeding clock signal CLKB has a frequency varying from 28.93 MHz to 90 MHz.

The selector control circuit 200 has a frequency-ratio register 30 for holding frequency-ratio information FR about the preceding and succeeding clock domains so that the selector 21 selects an optimal asynchronous absorption path based on the frequency-ratio information FR.

The frequency-ratio information FR is set in the frequency-ratio register 30 by a CPU (not shown), for example. The selector control circuit 200 gives a select signal SEL to an input S of the selector 21 so that the selector 21 is controlled to perform selection based on the information set in the frequency-ratio register 30. As a result, a signal SIGN is supplied from an output Z of the selector 21 to the fourth flip-flop 14.

Figure 3:
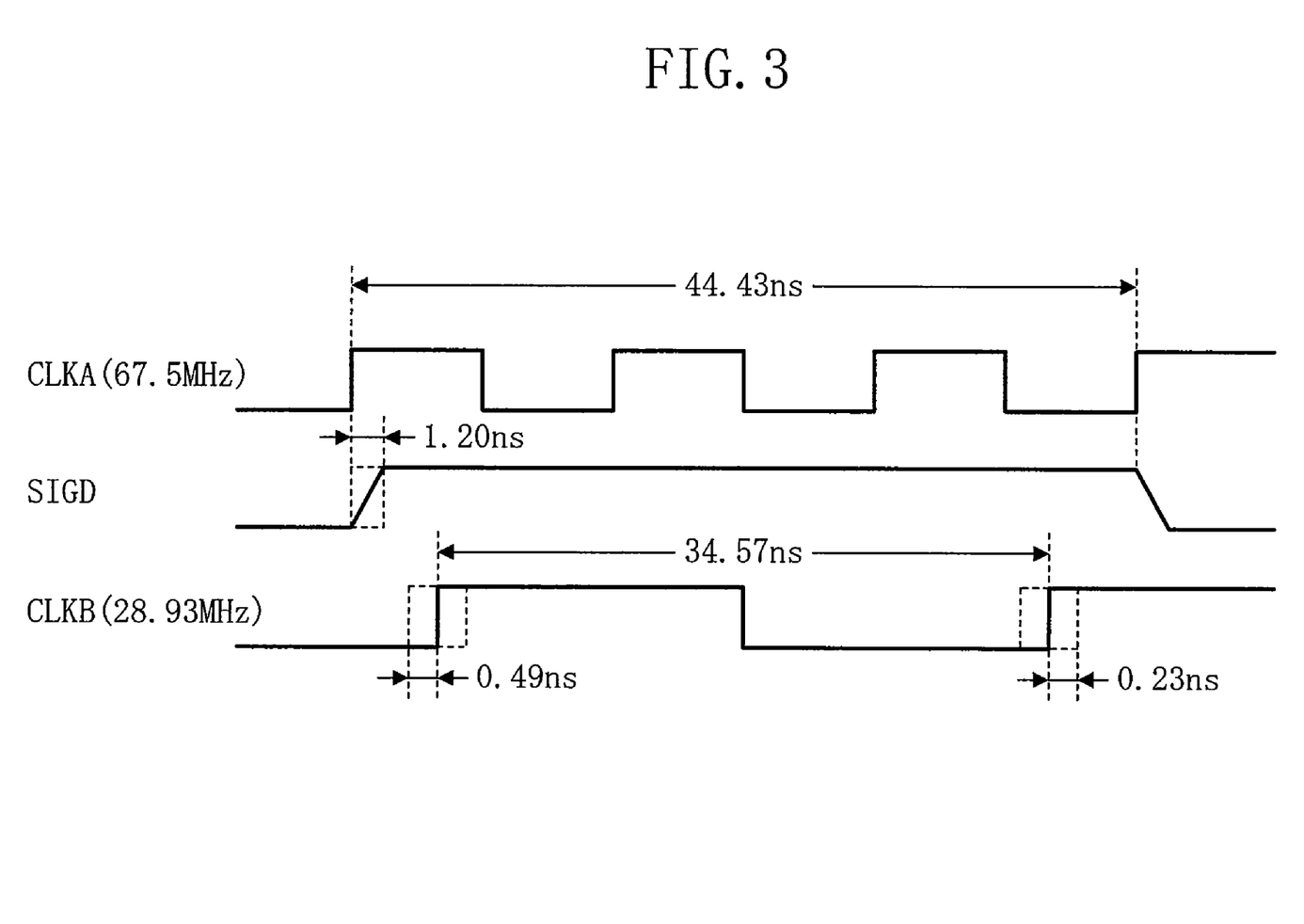
FIG. 3 is a diagram showing waveforms in the asynchronous absorption circuit of FIG. 2, where a preceding clock frequency is 67.5 MHz and a succeeding clock frequency is 28.93 MHz.

FIG. 3 is a diagram showing waveforms in the asynchronous absorption circuit of FIG. 2, where the preceding clock frequency is 67.5 MHz and the succeeding clock frequency is 28.93 MHz. In this case, the first input W of the selector 21 is selected, and the signal SIGD that is obtained by expanding the HIGH period of the input signal SIG by a factor of three is supplied to the fifth flip-flop 15. It is here assumed that a delay from the transition of a clock input (CLKA) of the fourth flip-flop 14 to a data output Q (SIGD) is 1.20 ns or less, and a setup time of the fifth flip-flop 15 that operates in synchronization with the succeeding clock signal CLKB is 0.49 ns or less, and a hold time of the fifth flip-flop 15 is 0.23 ns or less. In this case, the following is satisfied.

$$1.20+0.49+34.57+0.23=36.49<44.43$$

Therefore, a rising clock edge of 28.93 MHz that can stably latch the signal SIGD is certainly present within three cycles of 67.5 MHz.

Figure 4:
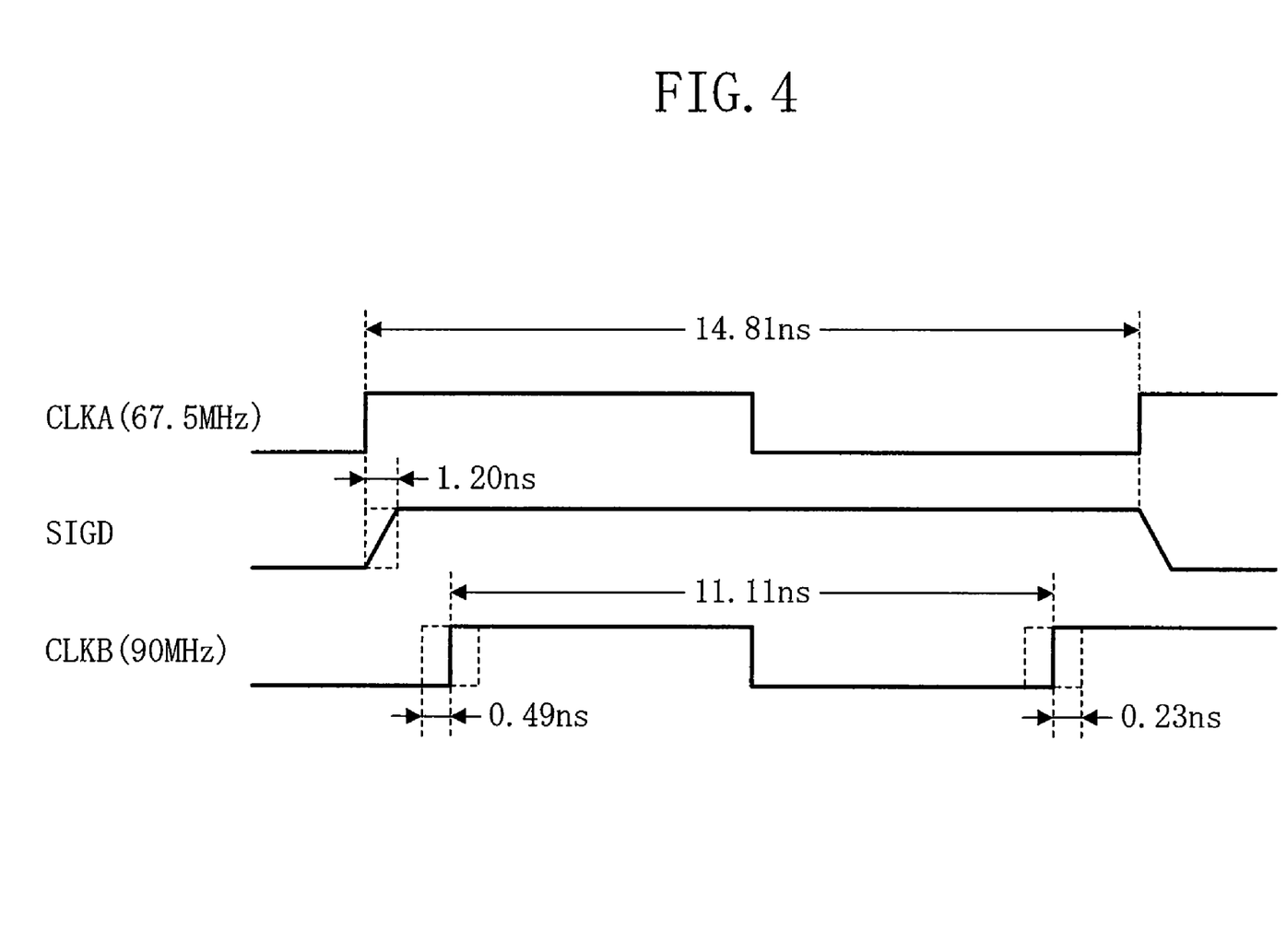
FIG. 4 is a diagram showing waveforms in the asynchronous absorption circuit of FIG. 2, where a preceding clock frequency is 67.5 MHz and a succeeding clock frequency is 90 MHz.

FIG. 4 is a diagram showing waveforms in the asynchronous absorption circuit of FIG. 2, where the preceding clock frequency is 67.5 MHz and the succeeding clock frequency is 90 MHz. In this case, the third input Y of the selector 21 is selected, and the input signal SIG as it is supplied as the signal SIGD to the fifth flip-flop 15. It is also here assumed that the delay from the transition of the clock input (CLKA) of the fourth flip-flop 14 to the data output Q (SIGD) is 1.20 ns or less, and the setup time of the fifth flip-flop 15 that operates in synchronization with the succeeding clock signal CLKB is 0.49 ns or less, and the hold time of the fifth flip-flop 15 is 0.23 ns or less. In this case, the following is satisfied.

$$1.20+0.49+11.11+0.23=13.03<14.81$$

Therefore, a rising clock edge of 90 MHz that can stably latch the signal SIGD is certainly present within one cycle of 67.5 MHz.

As described above, according to the configuration of FIG. 2, for example, when the preceding clock frequency is 67.5 MHz and the succeeding clock frequency is 28.93 MHz, and this information is set in the frequency-ratio register 30, a path that employs a pulse that is expanded to three cycles of the preceding clock signal CLKA is selected, so that stable signal transfer can be performed. Also, when the succeeding clock frequency changes to 90 MHz, and this information is similarly set in the frequency-ratio register 30, a path in which a pulse is not expanded is selected, so that data transfer can be performed without a deterioration in performance.

Figure 5:
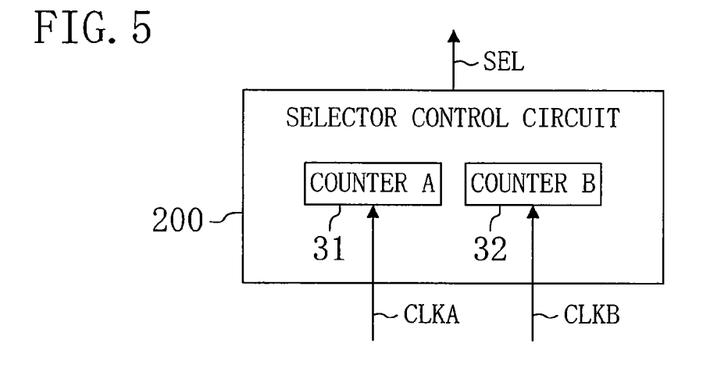
FIG. 5 is a diagram showing a first variation of the selector control circuit of FIG. 2.

FIG. 5 shows a first variation of the selector control circuit 200 of FIG. 2. The selector control circuit 200 of FIG. 5 has a frequency determining section including a first frequency counter 31 for measuring the preceding clock frequency from a count value of the preceding clock signal CLKA within a predetermined period, and a second frequency counter 32 for measuring the succeeding clock frequency from a count value of the succeeding clock signal CLKB within a predetermined period. An optimal asynchronous absorption path is dynamically selected based on the result of measurement of these frequencies.

According to the configuration of FIG. 5, even when the preceding and succeeding clock frequencies change, an optimal asynchronous absorption path can be dynamically selected without setting by the CPU. Therefore, a deterioration in performance of the asynchronous absorption circuit can be suppressed, and the load of software control can be reduced.

Figure 6:
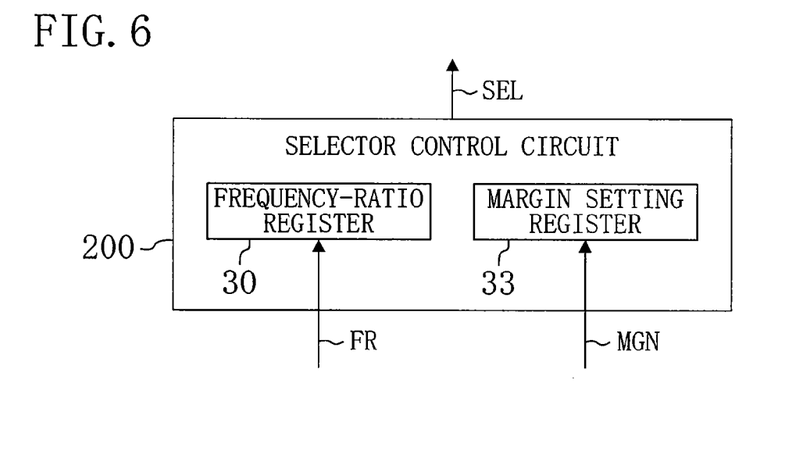
FIG. 6 is a diagram showing a second variation of the selector control circuit of FIG. 2.

FIG. 6 shows a second variation of the selector control circuit 200 of FIG. 2. The selector control circuit 200 of FIG. 6 has, in addition to the frequency-ratio register 30, a margin setting register 33 for holding margin information MGN containing the setup time and the hold time (see FIGS. 3 and 4) that should be considered when an optimal asynchronous absorption path is selected.

The configurations of FIGS. 2 and 5 are effective when the preceding and succeeding clock frequencies are present within a frequency range in which a margin that is one of the library characteristics can be ignored. According to the configuration of FIG. 6, even when a path needs to be selected in view of a margin (e.g., a case where one cycle of the frequency of the preceding clock signal CLKA is 10 ns, one cycle of the succeeding clock signal CLKB is 11 ns, and margins, such as the setup time, the hold time and the like, are of the order of nanoseconds), the asynchronous absorption circuit is substantially free from an erroneous operation since the asynchronous absorption circuit has the margin setting register 33 that can set the margin information MGN, and performs path selection in view of the margin information MGN.

Figure 7:
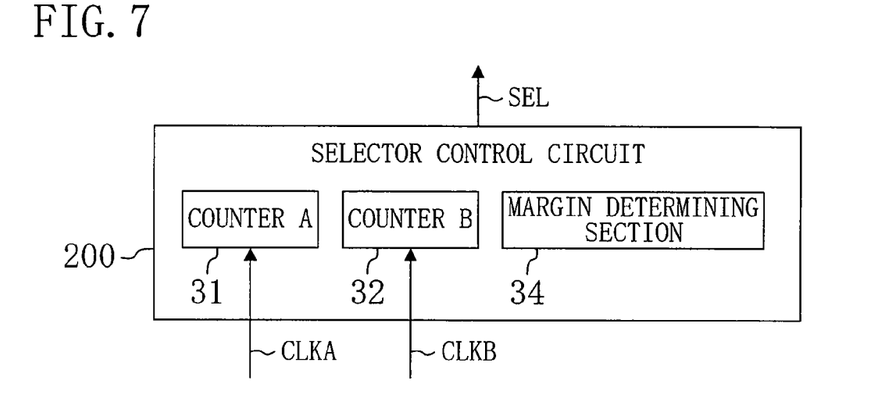
FIG. 7 is a diagram showing a third variation of the selector control circuit of FIG. 2.

FIG. 7 shows a third variation of the selector control circuit 200 of FIG. 2. The selector control circuit 200 of FIG. 7 has, in addition to a frequency determining section including the frequency counters 31 and 32, and a margin determining section 34 for selecting an optimal asynchronous absorption path in view of margin information including the setup time and the hold time.

According to the configuration of FIG. 7, in a frequency region in which a margin needs to be considered, the asynchronous absorption circuit can achieve asynchronous absorption without setting the frequency-ratio information FR or the margin information MGN from the CPU, which are required every time the preceding and succeeding clock frequencies change in the configuration of FIG. 6. As a result, in the asynchronous absorption circuit, a deterioration in performance can be suppressed and software processing can be reduced in a frequency region in which a margin should be considered.

Figure 8:
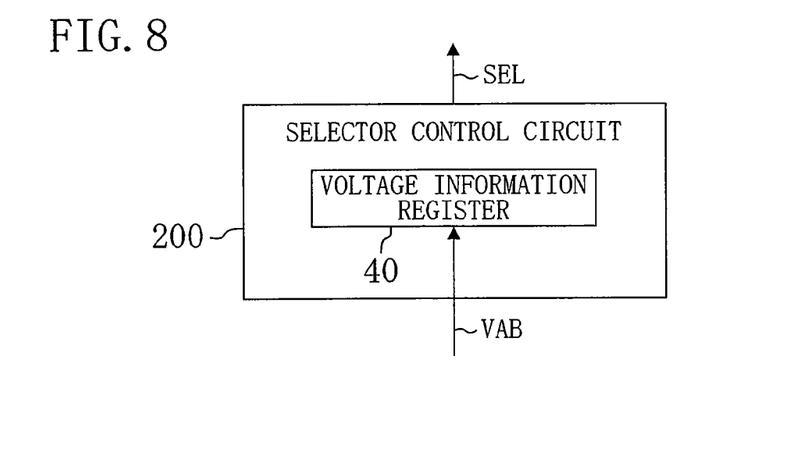
FIG. 8 is a diagram showing a fourth variation of the selector control circuit of FIG. 2.

FIG. 8 shows a fourth variation of the selector control circuit 200 of FIG. 2. The selector control circuit 200 of FIG. 8 has a voltage information register 40 for holding voltage information VAB when the frequencies of the preceding and succeeding circuits change in association with their respective circuit voltages, and selects an optimal asynchronous absorption path based on the voltage information VAB.

According to the configuration of FIG. 8, even when the frequencies of the preceding and succeeding circuits change in association with their respective voltage levels, an optimal asynchronous absorption path that can suppress a deterioration in transfer performance can be selected.

Figure 9:
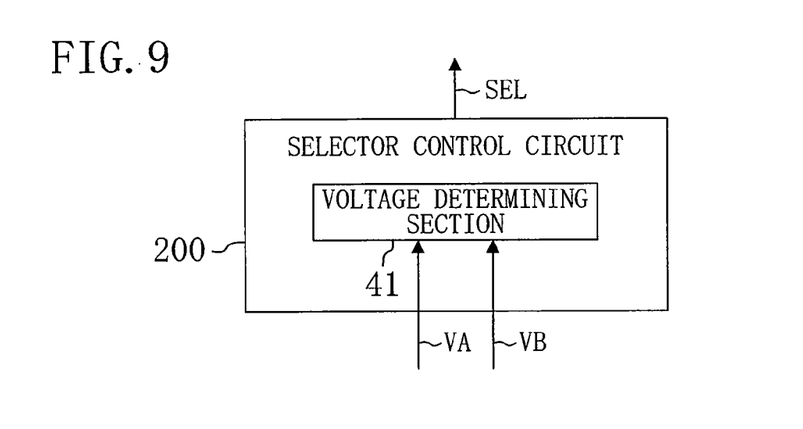
FIG. 9 is a diagram showing a fifth variation of the selector control circuit of FIG. 2.

FIG. 9 shows a fifth variation of the selector control circuit 200 of FIG. 2. The selector control circuit 200 of FIG. 9 has a voltage determining section 41 for, when the preceding and succeeding circuit frequencies change in association with their respective circuit voltages VA and VB, measuring the circuit voltages VA and VB, and dynamically selects an optimal asynchronous absorption path based on the result of measurement of the voltages.

According to the configuration of FIG. 9, asynchronous absorption can be achieved without setting the voltage information VAB from the CPU, which is required every time the voltage level changes in the configuration of FIG. 8. As a result, suppression of a deterioration in transfer performance and a reduction in software processing can be simultaneously achieved in the asynchronous absorption circuit.

Figure 10:
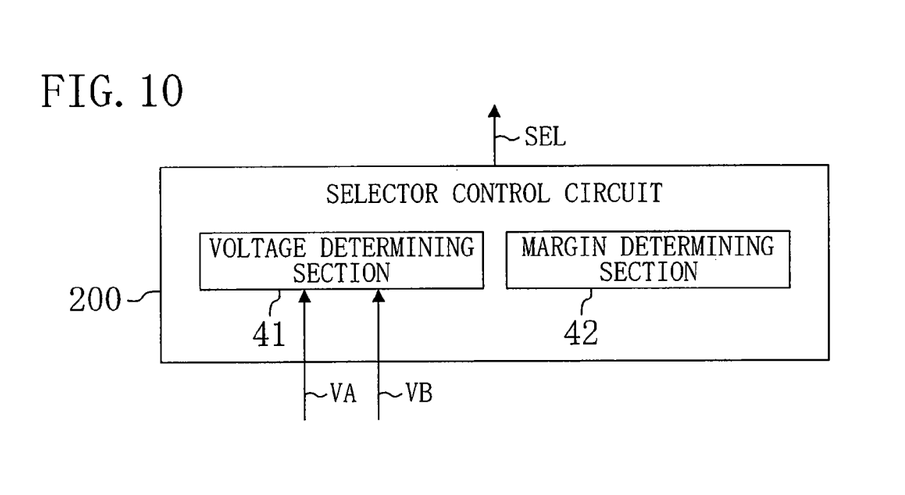
FIG. 10 is a diagram showing a sixth variation of the selector control circuit of FIG. 2.

FIG. 10 shows a sixth variation of the selector control circuit 200 of FIG. 2. The selector control circuit 200 of FIG. 10 has, in addition to the voltage determining section 41, a margin determining section 42 for selecting an optimal asynchronous absorption path in view of margin information including the setup time and the hold time.

The configurations of FIGS. 8 and 9 have a problem with a stable operation when the preceding and succeeding clock frequencies that are determined in association with circuit voltages are present in a frequency region in which a margin should be considered. However, according to FIG. 10, even when the clock frequencies that are determined in association with the circuit voltages are present in a region where a margin, such as a setup time, a hold time or the like, should be considered, stable asynchronous absorption can be achieved, so that suppression of a deterioration in transfer performance and a reduction in software processing can be simultaneously achieved.

As described above, the asynchronous absorption circuit with transfer performance optimizing function according to the present invention is useful as means for suppressing a deterioration in transfer performance in the asynchronous absorption circuit. An asynchronous absorption circuit whose operating frequency varies depending on the application is commonly employed in the configuration of a system LSI or a set system having a plurality of functions. There is a demand for a system LSI and a set system having higher performance for all digital AV apparatuses. Therefore, the present invention is applicable to any digital AV apparatuses, such as DTV, DVD, DSC and the like.

What is claimed is:

1. An asynchronous absorption circuit provided at an interface between two clock domains having operating frequencies, at least one of the operating frequencies of the clock domains varying depending on an application, the circuit comprising:
a pulse generating circuit including a plurality of asynchronous absorption paths in which a pulse signal is expanded to different degrees, and a selector for selecting any of the plurality of asynchronous absorption paths; and
a selector control circuit for controlling the selector so that the selector selects an optimal asynchronous absorption path, depending on the application;
wherein the selector control circuit includes a frequency-ratio register for holding frequency-ratio information about the two clock domains so that an optimal asynchronous absorption path is selected based on the frequency-ratio information, and
the selector control circuit further includes a margin setting register for holding margin information containing a setup time and a hold time to be considered during the selection of an optimal asynchronous absorption path.

2. An asynchronous absorption circuit provided at an interface between two clock domains having operating frequencies, at least one of the operating frequencies of the clock domains varying depending on an application, the circuit comprising:
a pulse generating circuit including a plurality of asynchronous absorption paths in which a pulse signal is expanded to different degrees, and a selector for selecting any of the plurality of asynchronous absorption paths; and
a selector control circuit for controlling the selector so that the selector selects an optimal asynchronous absorption path, depending on the application;
wherein the selector control circuit has a frequency determining section for measuring the two clock domain frequencies so that an optimal asynchronous absorption path is dynamically selected based on a result of the frequency measurement, and
the selector control circuit further includes a margin determining section for selecting an optimal asynchronous absorption path in view of margin information containing a setup time and a hold time as well as the frequency measurement result.

3. An asynchronous absorption circuit provided at an interface between two clock domains having operating frequencies, at least one of the operating frequencies of the clock domains varying depending on an application, the circuit comprising:
a pulse generating circuit including a plurality of asynchronous absorption paths in which a pulse signal is expanded to different degrees, and a selector for selecting any of the plurality of asynchronous absorption paths; and a selector control circuit for controlling the selector so that the selector selects an optimal asynchronous absorption path, depending on the application, wherein the selector control circuit includes a voltage information register for holding voltage information about the two clock domains when the two clock domain frequencies change in association with respective voltages of the clock domains so that an optimal asynchronous absorption path is selected based on the voltage information.

4. An asynchronous absorption circuit provided at an interface between two clock domains having operating frequencies, at least one of the operating frequencies of the clock domains varying depending on an application, the circuit comprising:

a pulse generating circuit including a plurality of asynchronous absorption paths in which a pulse signal is expanded to different degrees, and a selector for selecting any of the plurality of asynchronous absorption paths; and a selector control circuit for controlling the selector so that the selector selects an optimal asynchronous absorption path, depending on the application, wherein the selector control circuit includes a voltage determining section for measuring voltages of the two clock domains when the two clock domain frequencies change in association with respective voltages of the clock domains so that an optimal asynchronous absorption path is dynamically selected based on a result of the voltage measurement.

5. The asynchronous absorption circuit of claim 4, wherein the selector control circuit further includes a margin determining section for selecting an optimal asynchronous absorption path in view of margin information containing a setup time and a hold time as well as the voltage measurement result.

* * * * *